United States Patent
Sakuma et al.

(10) Patent No.: US 7,714,429 B2
(45) Date of Patent: May 11, 2010

(54) WAFER STRUCTURE WITH A PLURALITY OF FUNCTIONAL MACRO CHIPS FOR CHIP-ON-CHIP CONFIGURATION

(75) Inventors: Shouji Sakuma, Kasugai (JP); Yoshiyuki Ishida, Kasugai (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/528,323

(22) Filed: Sep. 28, 2006

(65) Prior Publication Data

US 2007/0222045 A1 Sep. 27, 2007

(30) Foreign Application Priority Data

Mar. 27, 2006 (JP) ............................. 2006-085702

(51) Int. Cl.
*H01L 23/02* (2006.01)
(52) U.S. Cl. ............... 257/698; 257/678; 257/E25.011; 257/E23.002; 257/E23.114; 257/207; 257/923; 361/820; 361/764; 361/823
(58) Field of Classification Search ................. 257/678, 257/E25.011, E23.002, E23.114, 207, 698, 257/778, 923; 361/820, 764, 823, 679
See application file for complete search history.

(56) References Cited

U.S. PATENT DOCUMENTS

| | | | | |
|---|---|---|---|---|
| 4,278,897 A | * | 7/1981 | Ohno et al. ................. | 326/101 |
| 4,855,958 A | * | 8/1989 | Ikeda ..................... | 365/230.08 |
| 5,331,572 A | * | 7/1994 | Takahashi ..................... | 716/11 |
| 5,837,557 A | * | 11/1998 | Fulford et al. ................. | 438/6 |
| 5,886,917 A | | 3/1999 | Yasukawa et al. | |
| 5,980,683 A | * | 11/1999 | Beck et al. ................... | 156/289 |
| 6,058,468 A | * | 5/2000 | Funyu .......................... | 712/39 |
| 6,310,815 B1 | * | 10/2001 | Yamagata et al. ....... | 365/230.03 |
| 6,414,852 B1 | | 7/2002 | Mizuno | |
| 6,802,043 B2 | * | 10/2004 | Haga .............................. | 716/1 |
| 6,900,478 B2 | * | 5/2005 | Miyagi ........................ | 257/202 |
| 7,091,564 B2 | * | 8/2006 | Hasegawa .................... | 257/372 |
| 2005/0169042 A1 | * | 8/2005 | Miyagi ........................ | 365/154 |
| 2006/0237798 A1 | * | 10/2006 | Hasegawa ................... | 257/372 |
| 2007/0044057 A1 | * | 2/2007 | Kitani et al. .................... | 716/8 |

FOREIGN PATENT DOCUMENTS

| | | |
|---|---|---|
| JP | 10-229164 | 8/1998 |
| JP | 11-233636 | * 8/1999 |
| JP | 2001-94037 | 4/2001 |
| JP | 2001-250886 | 9/2001 |
| WO | WO 00/44046 | 7/2000 |

OTHER PUBLICATIONS

Korean Patent Office Notice of Allowance, mailed Sep. 13, 2007 and issued in corresponding Korean Patent Application No. 10-2006-0100751.

* cited by examiner

Primary Examiner—Alexander O Williams

(57) ABSTRACT

A semiconductor device that reduces the size and cost of functional macro chips used in a chip-on-chip configuration. Functional macro chips each include a macro region. The macro regions are formed adjacent to one another. A pad region for testing the functional macro chips is formed surrounding the macro regions.

9 Claims, 2 Drawing Sheets

WAFER STRUCTURE WITH A PLURALITY OF FUNCTIONAL MACRO CHIPS FOR CHIP-ON-CHIP CONFIGURATION

CROSS-REFERENCE TO RELATED APPLICATIONS

This application is based upon and claims the benefit of priority from the prior Japanese Patent Application No. 2006-085702, filed on Mar. 27, 2006, the entire contents of which are incorporated herein by reference.

BACKGROUND OF THE INVENTION

The present invention relates to a semiconductor device, and more particularly, to a functional macro chip for a chip-on-chip configuration.

A semiconductor device having a chip-on-chip configuration includes a first chip and a plurality of second chips, or functional macro chips, bonded to the surface of the first chip. The functional macro chips are packaged together with the first chip. To reduce costs, such a semiconductor device requires miniaturization of the functional macro chips.

FIG. 1 is a schematic side view showing a semiconductor device 100 having a chip-on-chip configuration. A first chip 1 has a surface on which bumps B are formed. A plurality of functional macro chips 2 are bonded to the first chip 1 by means of the bumps B. Pads (not shown) are formed along the periphery of the first chip 1 and connected to external pins (not shown) by bonding wires 3.

FIG. 2 is a schematic plan view showing a prior art layout of a functional macro chip 2 shown in FIG. 1. The functional macro chip 2 includes a macro region 4 and a pad region 5, which is formed surrounding the macro region 4. The pad region 5 includes test pads and I/O cells used during wafer testing (operational testing of each functional macro chip 2). The pad region 5 becomes unnecessary after the wafer testing.

FIG. 3 is a schematic plan view showing another prior art layout of the functional macro chips 2 shown in FIG. 1 and formed on a wafer W. A pad region 5 is formed surrounding the macro region 4 of each functional macro chip 2. The macro regions 4 that are adjacent to each other share the pad region 5. This reduces the area occupied by the pad regions 5 on the wafer W and increases the quantity of functional macro chips 2 that may be formed from a single wafer W.

After wafer testing, the functional macro chips 2 are cut apart from one another along scribe lines 6, which are shown in FIG. 3.

Japanese Laid-Open Patent Publication No. 2001-94037 describes a semiconductor device including a first chip and a second chip mounted on the first chip. Bumps, which are formed on the first chip, are provided with test signals from a test probe to check the operation of the second chip.

SUMMARY OF THE INVENTION

In the macro chips 2 shown in FIG. 3, the pad regions 5 are formed between adjacent macro regions 4. This increases the area occupied by each functional macro chip and limits the quantity of chips that may be formed from a single wafer. During wafer testing, each functional macro chip is tested. This also increases testing costs.

In the semiconductor device described in the above publication, there is no need to arrange test pads on the second chip. However, the first and second chips must each undergo operational tests. This increases the testing costs.

The present invention provides a semiconductor device and a manufacturing method that reduces the size and cost of functional macro chips for a chip-on-chip structure.

One aspect of the present invention is a semiconductor device provided with a plurality of functional macro chips, each including a macro region. The macro regions are arranged adjacent to each other. A pad region for the functional macro chips surrounds the macro regions.

Another aspect of the present invention is a semiconductor device having a chip-on-chip configuration. The semiconductor device includes a first chip and a second chip including a macro region and mounted on the first chip. The second chip is substantially identical in size with the macro region.

A further aspect of the present invention is a method for forming a plurality of functional macro chips from a wafer. The method includes forming the functional macro chips, with each including a macro region, in the wafer, with the macro chips arranged adjacent to each other. The method further includes forming a pad region in the wafer, with the pad region being shared by the functional macro chips and surrounding the functional macro chips.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
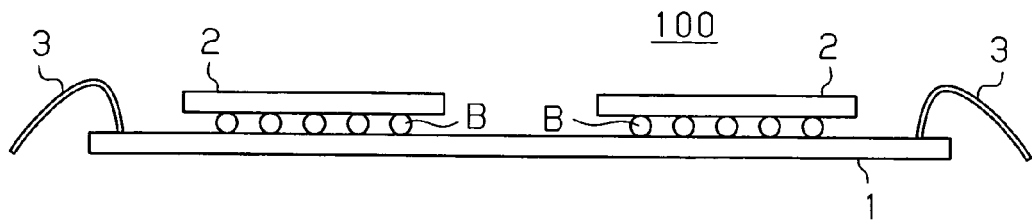
FIG. 1 is a schematic side view showing a semiconductor device having a chip-on-chip configuration.
Figure 2:
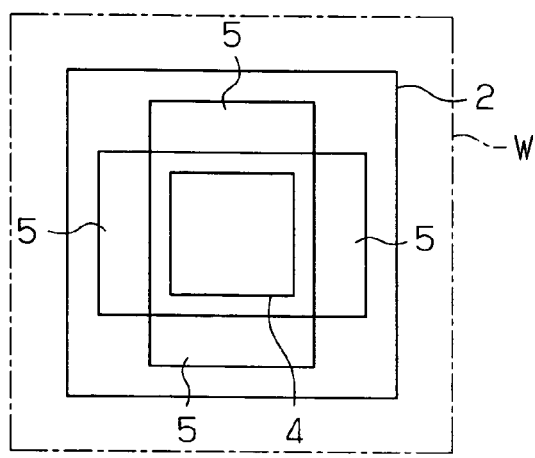
FIG. 2 is a schematic plan view showing a prior art layout of a functional macro chip shown in FIG. 1.
Figure 3:
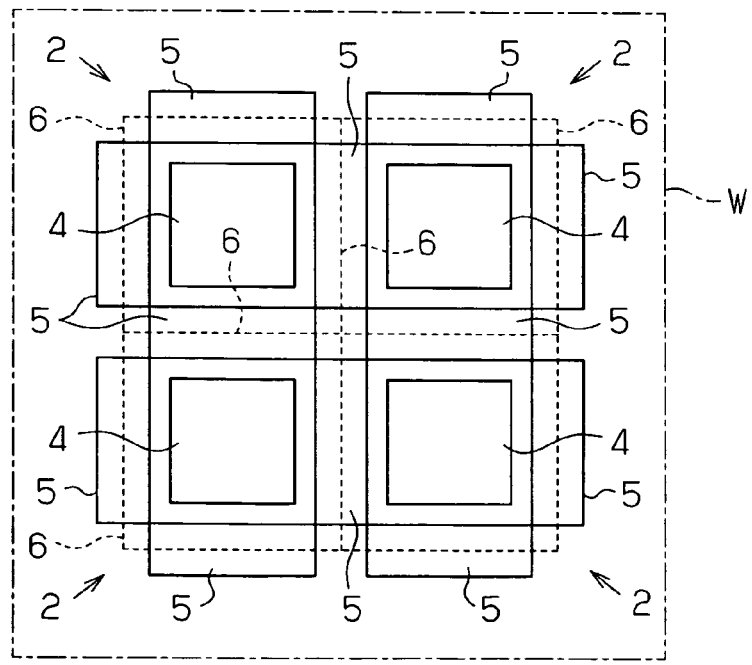
FIG. 3 is a schematic plan view showing a prior art layout of functional macro chips shown in FIG. 1.

In the drawings, like numerals are used for like elements throughout.

Figure 4:
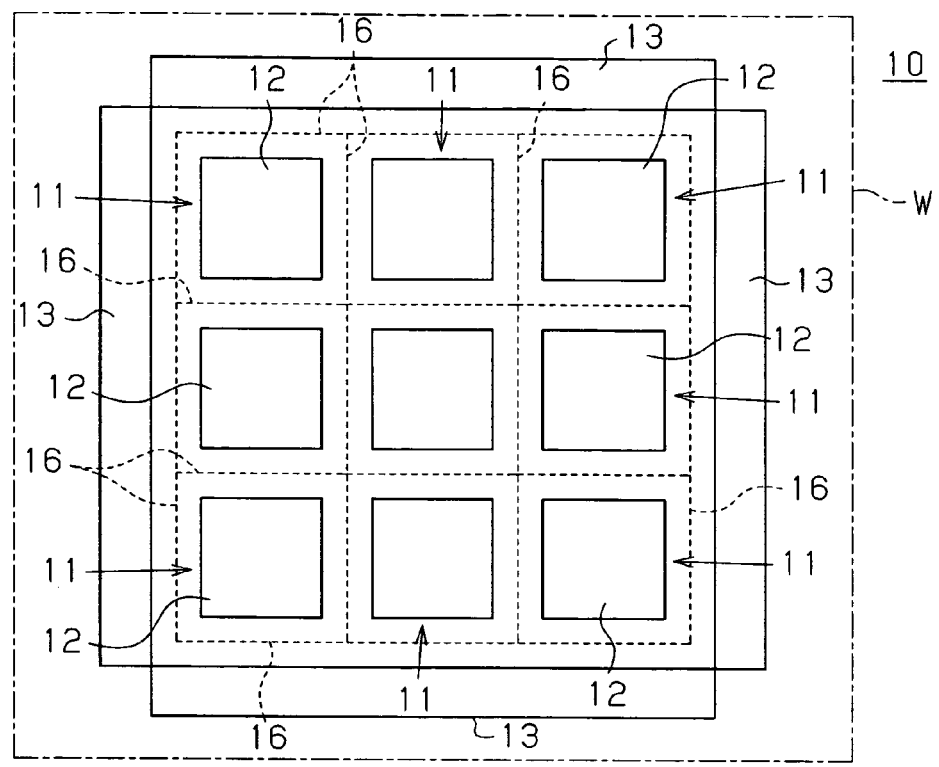
FIG. 4 is a schematic plan view showing a layout of functional macro chips in a semiconductor device according to a preferred embodiment of the present invention.

A semiconductor device 10 according to a preferred embodiment of the present invention will now be described with reference to the drawings. Referring to FIG. 4, the semiconductor device 10 includes a plurality of (nine in FIG. 4) functional macro chips 11 formed on the wafer W. Each functional macro chip 11 includes a macro region 12. Thus, the macro regions 12 are arranged adjacent to one another. A pad region 13 is formed on the wafer W surrounding the macro regions 12. Accordingly, the pad region 13 is not arranged between the macro regions 12. The pad region 13 includes test pads and I/O cells used during wafer testing (operational testing of each functional macro chip 11). The pad region 13 becomes unnecessary after the wafer testing.

Figure 5:
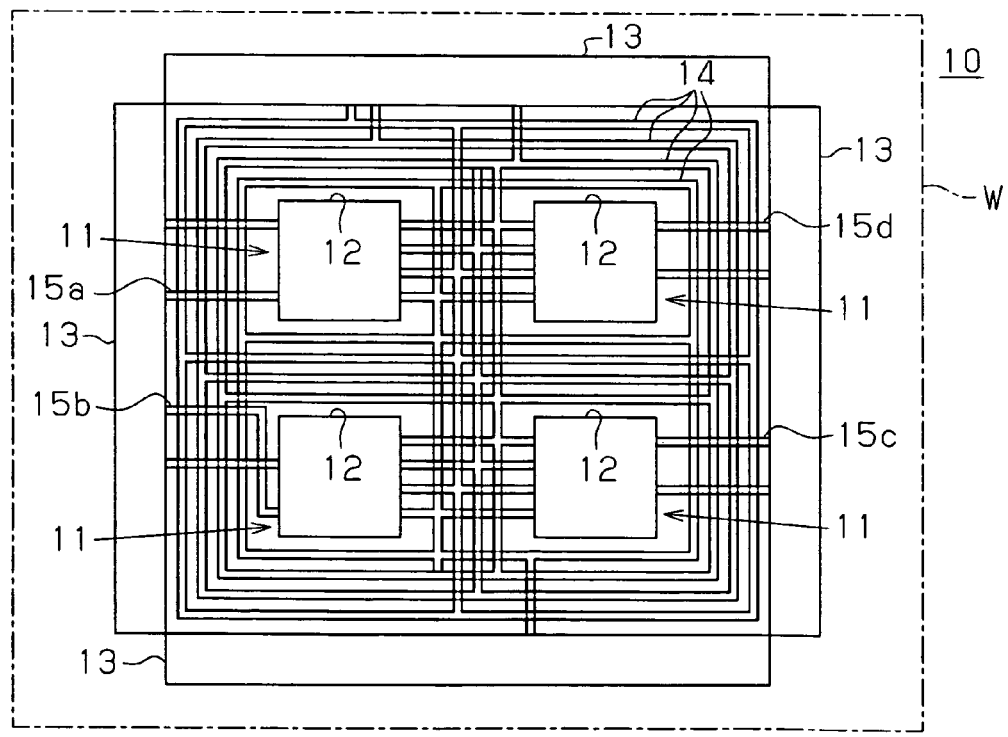
FIG. 5 is a schematic plan view showing connections of macro regions and pad regions shown in FIG. 4.

The macro regions 12 are each connected to the pad region 13 by wires. FIG. 5 is a schematic plan view showing connections of the macro regions 12 and the pad region 13 shown in FIG. 4. To simplify description, FIG. 5 shows the connection of four functional macro chips 11. A plurality of signal wires 14 (input/output signal wires) are arranged between the pad region 13 and the macro regions 12 and between the macro regions 12. Thus, the signal wires 14 connect the pad region 13 and the macro regions 12.

The macro regions 12 are respectively connected to the pad region 13 by output signal lines (input/output signal wires) 15a, 15b, 15c, and 15d. The signal wires 14 and the output signal lines 15a, 15b, 15c, and 15d are each connected to the test pads (not shown) in the pad region 13. Further, the signal wires 14 and the output signal lines 15a, 15b, 15c, and 15d are formed by multilayer wiring.

An operational test is conducted on each functional macro chip 11 by providing the test pads of the pad region 13 with a test signal. The test signal may be a signal commonly used by the macro chips 11 or a signal independently used by each macro chip 11. When a tester provides, via a test probe, a test signal to the test pads of the pad region 5, the test signal is provided to each macro region 12 via the I/O cells in the pad region 13 and the signal wires 14.

The macro regions 12 each generate an output signal, which is provided to the tester via the output signal lines 15a, 15b, 15c, and 15d, the I/O cells and the test pads in the pad region 13, and the test probe. The output signal is used to determine whether each macro region 12 is functioning properly.

After the operational test, the wafer W is cut along scribe lines 16 extending between the macro regions 12 and between the macro regions 12 and the pad region 13. This cuts the functional macro chips 11 apart from the wafer W. To facilitate understanding, the functional macro chips 11 cut along the scribe line 16 is shown being larger than the macro regions 12. However, the functional macro chips 11 are actually cut apart along the scribe lines 16 so that the functional macro chips 11 are identical in size with the macro regions 12. Then, as shown in FIG. 1, the separated functional macro chips 11 are bonded to the first chip 1 to form the semiconductor device 100 having a chip-on-chip configuration.

The functional macro chips 11 of the preferred embodiment have the advantages described below.

(1) In the plurality of functional macro chips 11 formed on the wafer W, the macro regions 12 are arranged adjacent to one another. The pad region 13 is formed surrounding the macro regions 12. After wafer testing, each functional macro chip 11 is cut apart from the wafer W along the scribe lines 16 extending around the macro region 12. Accordingly, after the cutting, each functional macro chip 11 does not include the pad region 13 and includes only the macro region 12. In other words, each functional macro chip 11 is cut apart from the wafer W so as to have substantially the same dimensions as the associated macro region 12. This reduces the area occupied by each functional macro chip 11 on the wafer W and miniaturizes each functional macro chip 11.

(2) The pad region 13 is not arranged between adjacent macro regions 12 and is arranged to surround the macro regions 12. The pad region 13 is shared by the macro regions 12. This increases the quantity of the chips formed from a single wafer and reduces manufacturing costs.

(3) The macro regions 12 of the macro chips 11 are connected to the pad region 13 by the same signal wires 14. Thus, during wafer testing, operational tests may be conducted in parallel on the functional macro chips 11 by providing the test pads in the pad region 13 with the same common test signal for the functional macro chips 11. This reduces testing costs.

(4) Each functional macro chip 11 includes only the macro region 12. Accordingly, in the semiconductor device 100 shown in FIG. 1, the functional macro chips 11 mounted on the first chip 1 are sized to be smaller than the functional macro chips 2 of the prior art. This increases the quantity of chips that may be mounted on the first chip 1.

It should be apparent to those skilled in the art that the present invention may be embodied in many other specific forms without departing from the spirit or scope of the invention. Particularly, it should be understood that the present invention may be embodied in the following forms.

A switch circuit may be arranged between the test pads and the output signal lines 15a, 15b, 15c, and 15d to sequentially switch the output signal lines that are connected to the test pads. This reduces the quantity of the test pads.

The test pads may be formed in the pad region 13, and the I/O cells may be formed in the macro regions 12.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   a plurality of functional macro chips separable from the semiconductor device, each including a macro region, wherein the macro regions are arranged adjacent to each other; and
   a pad region for the functional macro chips surrounding the macro regions.

2. The semiconductor device according to claim 1, further comprising:
   a plurality of input/output signal wires for connecting the macro regions and the pad region.

3. The semiconductor device according to claim 1, further comprising:
   a plurality of signal wires and a plurality of output signal lines connecting the macro regions and the pad region.

4. The semiconductor device according to claim 1, wherein the macro regions and the pad region are formed on a single wafer.

5. A semiconductor device having a chip-on-chip configuration, the semiconductor device comprising
   a first chip; and
   a second chip including a macro region and mounted on the first chip, wherein the second chip is substantially identical in size with the macro region;
   wherein the second chip is one of a plurality of functional macro chips formed in a wafer, the functional macro chips being separable from the wafer and arranged adjacent to each other, the wafer including the functional macro chips and a pad region, the pad region surrounding the functional macro chips.

6. A method for forming a plurality of functional macro chips from a wafer, the method comprising:
   forming the functional macro chips, with each including a macro region, in the wafer, with the macro chips arranged adjacent to each other; wherein the functional macro chips are separable from the wafer; and
   forming a pad region in the wafer, with the pad region being shared by the functional macro chips and surrounding the functional macro chips.

7. The method according to claim 6, further comprising:
   cutting the functional macro chips apart from the wafer so that the functional macro chips are each substantially identical in size to the corresponding macro region.

8. The semiconductor device according to claim 1, wherein each of the plurality of functional macro chips is substantially identical in size to the corresponding macro region.

9. The method according to claim 6, wherein each of the plurality of functional macro chips is substantially identical in size to the corresponding macro region.

* * * * *